United States Patent
Hayashi et al.

(10) Patent No.: US 8,765,557 B2
(45) Date of Patent: Jul. 1, 2014

(54) METHOD FOR MANUFACTURING SILICON CARBIDE SEMICONDUCTOR DEVICE

(71) Applicant: Sumitomo Electric Industries, Ltd., Osaka (JP)

(72) Inventors: Hideki Hayashi, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/736,582

(22) Filed: Jan. 8, 2013

(65) Prior Publication Data

US 2013/0210208 A1 Aug. 15, 2013

Related U.S. Application Data

(60) Provisional application No. 61/598,053, filed on Feb. 13, 2012.

(30) Foreign Application Priority Data

Feb. 13, 2012 (JP) ................. 2012-027936

(51) Int. Cl.
| | | |
|---|---|---|
| H01L 21/336 | (2006.01) | |
| H01L 21/265 | (2006.01) | |
| H01L 21/425 | (2006.01) | |
| H01L 29/66 | (2006.01) | |
| H01L 21/02 | (2006.01) | |
| H01L 21/04 | (2006.01) | |
| H01L 29/16 | (2006.01) | |
| H01L 29/423 | (2006.01) | |
| H01L 29/78 | (2006.01) | |

(52) U.S. Cl.
CPC .... *H01L 29/66068* (2013.01); *H01L 21/02378* (2013.01); *H01L 21/0445* (2013.01); *H01L 21/0465* (2013.01); *H01L 21/048* (2013.01); *H01L 29/1608* (2013.01); *H01L 29/4236* (2013.01); *H01L 29/7813* (2013.01)

USPC ................. 438/285; 438/518; 438/525

(58) Field of Classification Search
None
See application file for complete search history.

(56) References Cited

U.S. PATENT DOCUMENTS

| | | | |
|---|---|---|---|
| 7,368,783 B2* | 5/2008 | Mizukami et al. ............ 257/330 |
| 2005/0006699 A1 | 1/2005 | Sato et al. | |
| 2010/0059814 A1 | 3/2010 | Loechelt et al. | |
| 2010/0285647 A1* | 11/2010 | Ueno ............................ 438/270 |
| 2011/0297963 A1 | 12/2011 | Honaga et al. | |

FOREIGN PATENT DOCUMENTS

JP  2004-342660 A  12/2004

OTHER PUBLICATIONS

Hayashi et al., U.S. Appl. No. 13/736,432, filed Jan. 8, 2013.
Office Action issued in U.S. Appl. No. 13/736,432, dated Apr. 11, 2014.

* cited by examiner

*Primary Examiner* — Scott B Geyer
(74) *Attorney, Agent, or Firm* — Venable LLP; Michael A. Sartori

(57) ABSTRACT

A first layer constituting a first surface of a silicon carbide layer and of a first conductivity type is prepared. An internal trench is formed at a face opposite to the first surface of the first layer. Impurities are implanted such that the conductivity type of the first layer is inverted on the sidewall of the internal trench. By the implantation of impurities, there are formed from the first layer an implantation region located on the sidewall of the internal trench and of a second conductivity type, and a non-implantation region of the first conductivity type. A second layer of the first conductivity type is formed, filling the internal trench, and constituting the first region together with the non-implantation region.

5 Claims, 13 Drawing Sheets

15  13  12  11b  12  13  15

METHOD FOR MANUFACTURING SILICON CARBIDE SEMICONDUCTOR DEVICE

BACKGROUND OF THE INVENTION

1. Field of the Invention

The present invention relates to a method for manufacturing a silicon carbide semiconductor device, more particularly a method for manufacturing a silicon carbide semiconductor device having a gate electrode.

2. Description of the Background Art

It is known that there is a trade-off generally between the ON resistance and breakdown voltage in a semiconductor device for electric power. In recent years, there has been proposed a semiconductor device having a charge compensation structure such as a super junction structure for the purpose of improving the breakdown voltage while suppressing ON resistance. For example, Japanese Patent Laying-Open No. 2004-342660 discloses a power MOSFET (Metal Oxide Semiconductor Field Effect Transistor) having a charge compensation structure.

According to the art in the aforementioned publication, a $p^+$ type base layer functioning as a channel is folioed on a p-type pillar layer (charge compensation structure). Therefore, the impurities in the charge compensation structure will affect the channel property.

SUMMARY OF THE INVENTION

The present invention is directed to solve the aforementioned problem. An object of the present invention is to provide a method for manufacturing a silicon carbide semiconductor device that can have breakdown voltage improved while avoiding influence to the channel property and suppressing ON resistance.

A method for manufacturing a silicon carbide semiconductor device of the present embodiment is directed to a silicon carbide semiconductor device including a silicon carbide layer having a first surface and a second surface opposite to each other in a thickness direction, and includes the steps set forth below. A first layer constituting the first surface and of a first conductivity type is prepared. An internal trench having a bottom and a sidewall is formed at a face opposite to the first surface of the first layer. Impurities are implanted onto the sidewall of the internal trench such that the conductivity type of the first layer is inverted on the sidewall of the internal trench. By implanting impurities, there are formed from the first layer an implantation region located on the sidewall of the internal trench and of a second conductivity type differing from the first conductivity type, and a non-implantation region of the first conductivity type. A second layer of the first conductivity type is formed, filling the internal trench, and constituting a first region together with the non-implantation region. By forming the second layer, the implantation region is embedded in the first region. There are formed, on the first region, a second region of the second conductivity type, and a third region of the first conductivity type provided on the second region, isolated from the first region by the second region, and constituting at least a portion of the second surface. A gate insulation film is formed on the second region so as to connect the first region with the third region. A gate electrode is formed on the gate insulation film. A first electrode is formed on the first region. A second electrode is formed on the third region.

According to the silicon carbide semiconductor device obtained by the present manufacturing method, at least a portion of the electric field in the thickness direction caused by the fixed charge of one of the positive and negative polarity generated by depletion of the first region is compensated for by the fixed charge of the other polarity generated by depletion of the implantation region. In other words, a charge compensation structure is provided. Accordingly, the maximum value of the electric field intensity in the thickness direction is suppressed. Therefore, the breakdown voltage of the silicon carbide semiconductor device can be improved. According to the present manufacturing method, the implantation region is located away from the second region. Thus, the event of impurities in the implantation region affecting the second region functioning as a channel can be avoided.

Preferably, the step of forming an implantation region includes the step of irradiating the sidewall of the internal trench with an impurity ion beam in an oblique direction relative to the first surface. Accordingly, the impurity ion beam can be delivered effectively on the sidewall.

Preferably, in the step of irradiating with an impurity ion beam, the oblique direction is selected such that at least a portion of the bottom of the internal trench is located in a shadow of the sidewall. Accordingly, at least a portion of the bottom of the internal trench does not become an implantation region. At least a portion of the bottom of the internal trench is maintained at the first conductivity type. Therefore, a current path of the first conductivity type passing through the internal trench can be provided. Thus, the ON resistance of the silicon carbide semiconductor device can be reduced.

Preferably, the step of forming an internal trench is carried out through etching having a physical etching action. Accordingly, the etching directed to forming an internal trench can be carried out more perpendicularly. Therefore, a side face SD of the implantation region constituting the inner face of the internal trench can be set along the thickness direction. Thus, charge compensation by the implantation region can be carried out more sufficiently.

Preferably in the manufacturing method set forth above, there is formed a gate trench having a sidewall, at the second surface, passing through the third region and the second region up to the first region, and located away from the implantation region. The gate trench is formed by thermal etching. Accordingly, the plane orientation of the sidewall of the gate trench can be set to a specific one crystallographically.

In the description above, the recitation of "a first electrode is formed on the first region" may imply any of a first electrode is formed "directly on" and "indirectly on" the first region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
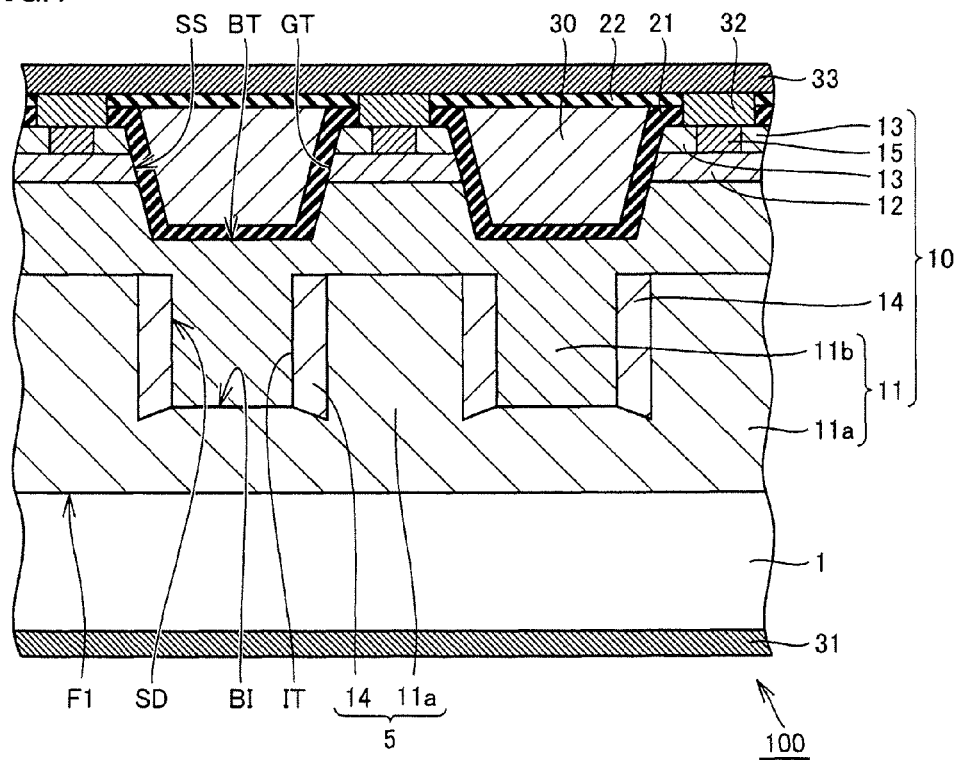
FIG. 1 is a partial sectional view schematically representing a configuration of a silicon carbide semiconductor device according to a first embodiment of the present invention.

Embodiments of the present invention will be described hereinafter based on the drawings. In the drawings set forth below, the same or corresponding elements have the same reference characters allotted, and description thereof will not be repeated. As to the crystallographic notation in the present specification, a specific plane is represented by ( ), whereas a group of equivalent planes is represented by { }. For a negative index, a bar (−) is typically allotted above a numerical value in the crystallographic aspect. However, in the present specification, a negative sign will be attached before the numerical value.

First Embodiment

First, a structure of an MOSFET 100 (silicon carbide semiconductor device) according to the present embodiment will be described with reference to FIGS. 1-5.

As shown in FIG. 1, MOSFET 100 includes a single crystal substrate 1, a SiC layer 10 (silicon carbide layer), a drain electrode 31 (first electrode), a source electrode 32 (second electrode), a gate oxide film 21 (gate insulation film), an interlayer insulation film 22, a gate electrode 30, and a source interconnection layer 33.

Single crystal substrate 1 is made of silicon carbide of the n-type (first conductivity type). For example, single crystal substrate 1 is formed of silicon carbide having a single crystal structure of either hexagonal system or cubic system. Preferably, a main surface (the top face in the drawing) having an off angle within 5 degrees from the reference plane is provided at single crystal substrate 1. The reference plane is the {000-1} plane, more preferably the (000-1) plane, for the hexagonal system. For the cubic system, the reference plane is the {111} plane. Preferably, the off angle is greater than or equal to 0.5 degrees.

Figure 2:
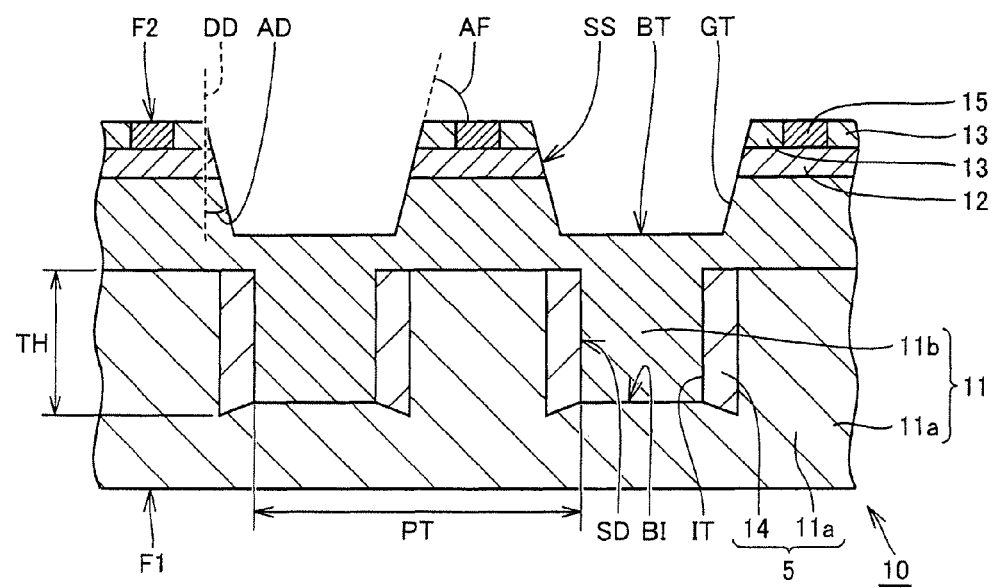
FIG. 2 is a partial sectional view taken along line II-II in each of FIGS. 3-5, schematically representing a configuration of a silicon carbide layer in the silicon carbide semiconductor device of FIG. 1.
Figure 3:
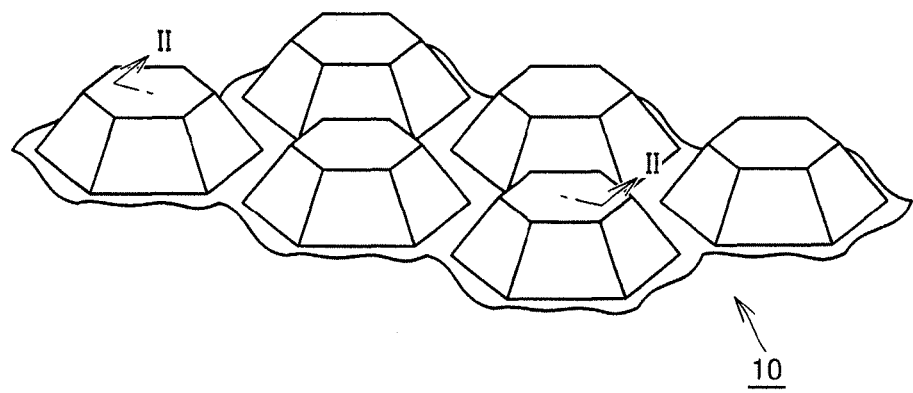
FIGS. 3 and 4 are a partial perspective view and a partial plan view, respectively, schematically representing a configuration of the silicon carbide layer in FIG. 2.

Further referring to FIGS. 2-5, SiC layer 10 has a lower face F1 (first surface) and an upper face F2 (second surface) opposite to each other in the thickness direction DD (FIG. 2). Lower face F1 and upper face F2 are substantially parallel to each other. SiC layer 10 also includes a lower layer 5 (first layer), an upper layer 11b (second layer), a p region 12 (second region), an n region 13 (third region), and a p$^+$ contact region 15.

Lower layer 5 includes a non-implantation region 11a and a charge compensation region 14 (implantation region). Non-implantation region 11a is of an n type (first conductivity type). Non-implantation region 11a constitutes a lower face F1 of SiC layer 10. At the face opposite to lower face F1 of lower layer 5, an internal trench IT having a bottom BI and a sidewall SD is provided. A pitch PT (FIG. 2) of internal trench IT is preferably identical to the pitch of a gate trench GT that will be described afterwards.

Charge compensation region 14 is located on non-implantation region 11a, and on sidewall SD of internal trench IT. Charge compensation region 14 is of a p type (second conductivity type differing from the first conductivity type).

Upper layer 11b fills internal trench IT. Upper layer 11b is of the n type (first conductivity type). Upper layer 11b constitutes n$^-$ drift region 11 (first region) together with non-implantation region 11a. Charge compensation region 14 is embedded in first region 11. Each of non-implantation region 11a and upper layer 11b may be formed of the same material with the same impurity concentration. The impurity concentration of n$^-$ drift region 11 is preferably greater than or equal to $5 \times 10^{15}$ cm$^{-3}$ and less than or equal to $5 \times 10^{17}$ cm$^{-3}$, more preferably greater than or equal to $5 \times 10^{15}$ cm$^{-3}$ and less than or equal to $5 \times 10^{16}$ cm$^{-3}$.

Charge compensation region 14 is located away from each of lower face F1 and p region 12. Specifically, charge compensation region 14 is isolated from lower face F1 by non-implantation region 11a of n$^-$ drift region 11, and isolated from p region 12 by upper layer 11b of n$^-$ drift region 11. Charge compensation region 14 has a thickness TH (FIG. 2) greater than 5 μm in thickness direction DD.

Preferably, the impurity concentration of charge compensation region 14 is higher than the impurity concentration of n$^-$ drift region 11. This is because the width of charge compensation region 14 (the horizontal dimension in FIG. 2) is smaller than the width of n$^-$ drift region 11 (the total of the width of non-implantation region 11a and the width of upper layer 11b) at the height position where charge compensation region 14 is provided (the position in the vertical direction in FIG. 2).

The impurity concentration of charge compensation region 14 is preferably greater than or equal to $1 \times 10^{16}$ cm$^{-3}$ and less than or equal to $2\times10^{18}$cm$^{-3}$, more preferably greater than or equal to $1\times10^{16}$cm$^{-3}$ and less than or equal to $2\times10^{17}$cm$^{-3}$.

P region 12 is provided on upper layer 11b of n⁻ drift region 11, and is of the p type (second conductivity type differing from the first conductivity type). N region 13 is provided on p region 12, isolated from n⁻ drift region 11 by p region 12, and is of the n type (first conductivity type).

At top face F2, a gate trench GT having a bottom BT and a sidewall SS is provided, passing through n region 13 and p region 12 up to n⁻ drift region 11. Gate trench GT is located away from charge compensation region 14. Sidewall SS includes each portion of n⁻ drift region 11, p region 12, and n region 13.

P⁺ contact region 15 is directly provided on a portion of p region 12, and constitutes a portion of upper face F2 of SiC layer 10.

Gate oxide film 21 is provided on p region 12 so as to connect n⁻ drift region 11 with n region 13. Specifically, gate oxide film 21 covers p region 12 of SiC layer 10 on sidewall SS. Gate electrode 30 is provided on gate oxide film 21. Accordingly, gate electrode 30 is located on p region 12 of SiC layer 10 with gate oxide film 21 therebetween.

Drain electrode 31 is an ohmic electrode provided on non-implantation region 11a of n⁻ drift region 11 of SiC layer 10 with single crystal substrate 1 therebetween. Source electrode 32 is an ohmic electrode directly provided on n region 13 and p⁺ contact region 15 of SiC layer 10.

Preferably, sidewall SS of gate trench GT is oblique relative to upper face F2 of SiC layer 10 by just an angle AF (FIG. 2) greater than 0° and smaller than 90°. More preferably, the angle of a side face SD (FIG. 2) of internal trench IT relative to thickness direction DD is smaller as compared to an angle AD (FIG. 2) of sidewall SS of gate trench GT relative to thickness direction DD. In other words, the angle of side face SD (FIG. 2) of charge compensation region 14 relative to thickness direction DD is smaller as compared to angle AD (FIG. 2) of gate trench GT relative to thickness direction DD.

SiC layer 10 may have a crystal structure of hexagonal system. In this case, sidewall SS of gate trench GT of SiC layer 10 preferably includes a region constituted of at least one of a {0-33-8} plane and {0-11-4} plane. SiC layer 10 may have a crystal structure of cubic system. In this case, sidewall SS of gate trench GT of SiC layer 10 preferably includes a region constituted of the {100} plane.

A method for manufacturing MOSFET 100 will be described hereinafter.

Figure 6:
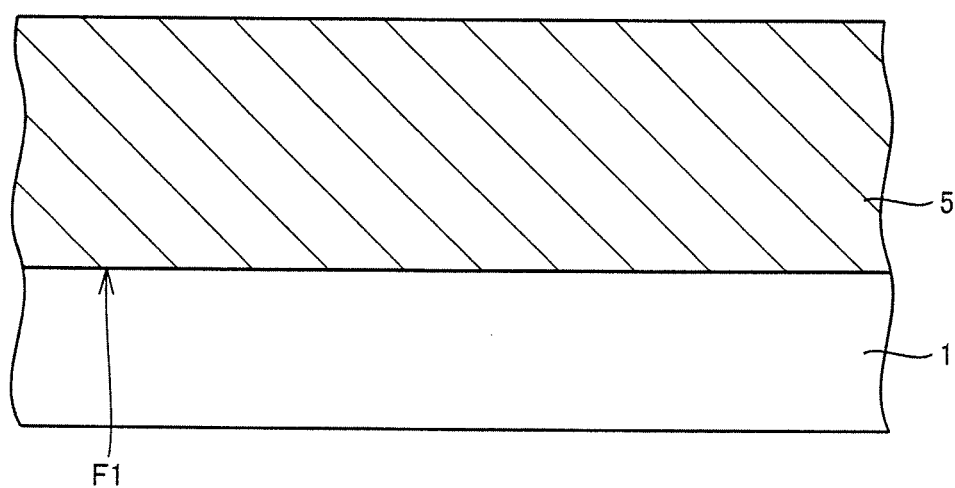
FIG. 6 is a partial sectional view schematically representing a first step in a method for manufacturing a silicon carbide semiconductor device according to the first embodiment of the present invention.

As shown in FIG. 6, epitaxial-growth of n-type silicon carbide is carried out on single crystal substrate 1. Accordingly, lower layer 5 (first layer) having lower face F1 facing single crystal substrate 1 is foamed. The epitaxial-growth of silicon carbide can be carried out by chemical vapor deposition (CVD) using mixture gas of silane (SiH$_4$) and propane (C$_3$H$_8$) as the raw material gas and hydrogen gas (H$_2$) as the carrier gas. Silicon carbide can be doped n-type by using nitrogen (N) or phosphorus (P), for example, for the impurities.

Figure 7:
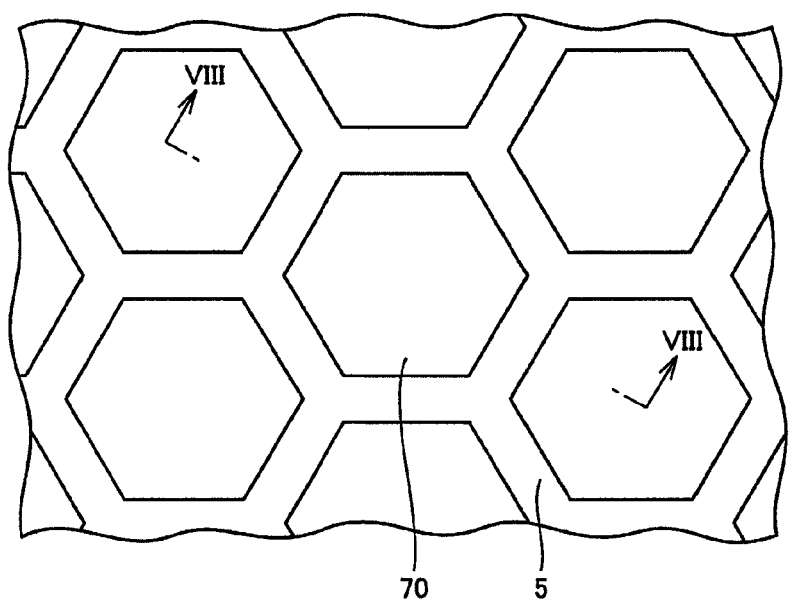
FIG. 7 is a partial plan view schematically representing a second step in the method for manufacturing a silicon carbide semiconductor device according to the first embodiment of the present invention.
Figure 8:
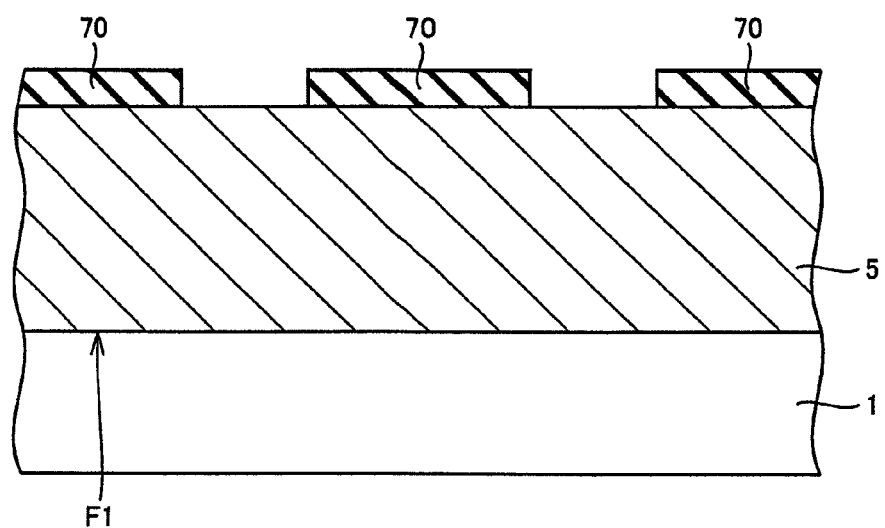
FIG. 8 is a schematic partial sectional view taken along line VIII-VIII in FIG. 7.

As shown in FIGS. 7 and 8, a mask layer 70 is formed on lower layer 5. Mask layer 70 has an opening corresponding to the position of internal trench IT (FIG. 2). Mask layer 70 is formed of silicon oxide (SiO$_2$), for example.

Figure 9:
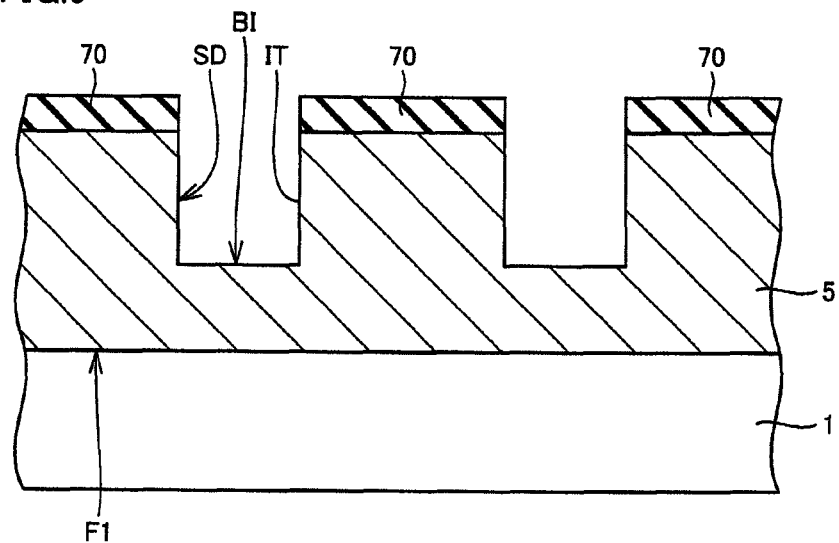
FIGS. 9-12 are partial sectional views schematically representing third to sixth steps, respectively, in the method for manufacturing a silicon carbide semiconductor device according to the first embodiment of the present invention.

As shown in FIG. 9, internal trench IT having a bottom BI and sidewall SD is formed at the face opposite to lower face F1 of lower layer 5 by etching mask layer 70. Preferably, this etching is carried out through etching having a physical etching action. For such etching, reactive ion etching (RIE) or ion beam etching (IBE), for example, can be cited. Particularly, inductive coupling plasma (ICP) RIE can be used for RIE. Specifically, ICP-RIE using SF$_6$ or mixture gas of SF$_6$ and O$_2$ as the reaction gas can be employed.

Figure 10:
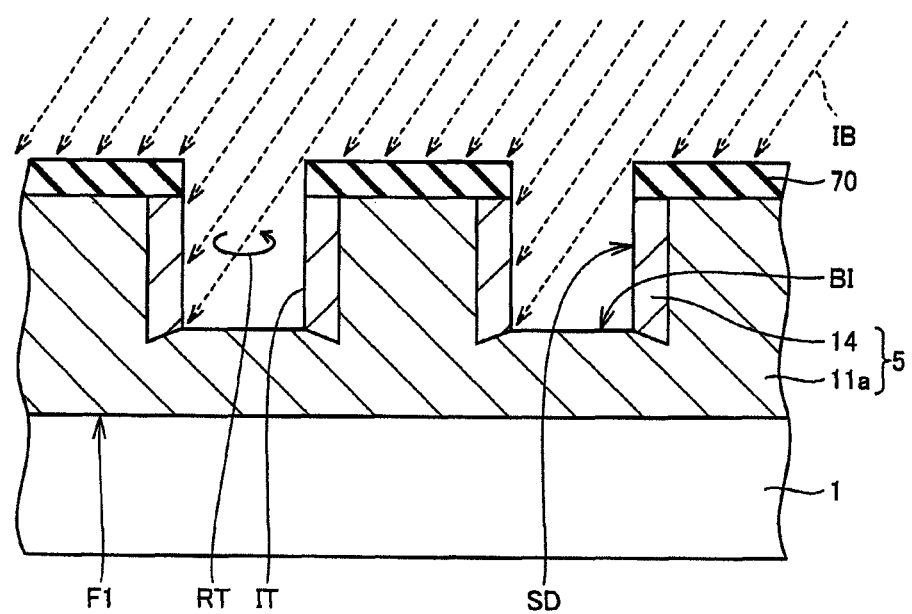

As shown in FIG. 10, impurities are implanted onto sidewall SD of internal trench IT such that the conductivity type of lower layer 5 on sidewall SD of internal trench IT is inverted. By the implantation of impurities, there are formed charge compensation region 14 (implantation region) located on sidewall SD of internal trench IT and of the second conductivity type differing from the first conductivity type, and a non-implantation region 11a of the first conductivity type, from lower layer 5. Specifically, the sidewall of internal trench IT is irradiated with an impurity ion beam IB in an oblique direction relative to lower face F1. This oblique direction is selected such that at least a portion of bottom BI of internal trench IT is located in a shadow of sidewall SD. In the case where the direction of impurity ion beam IB is perpendicular to bottom face F1, bottom BI will be irradiated entirely with impurity ion beam IB. As the direction of impurity ion beam IB becomes more oblique with the perpendicular direction relative to lower face F1 (in the drawing, the vertical direction) as the reference, the influence of bottom BI located in the shadow of sidewall SD becomes greater. When the direction of impurity ion beam IB is greatly oblique enough with the perpendicular direction relative to lower face F1 (in the drawing, the vertical direction) as the reference, substantially at least a portion of bottom BI will not be subject to impurity implantation. During irradiation with impurity ion beam IB, single crystal substrate 1 is rotated in-plane, as indicated by arrow RT in the drawing. Accordingly, impurities can be implanted towards sidewall SD having various directions. The direction of impurity ion beam IB may be rotated instead of single crystal substrate 1 being rotated.

During irradiation with impurity ion beam IB, the face of lower layer 5 opposite to lower face F1 is shielded by mask layer 70 from impurity ion beam IB. After irradiation of impurity ion beam IB, mask layer 70 is removed.

Figure 11:
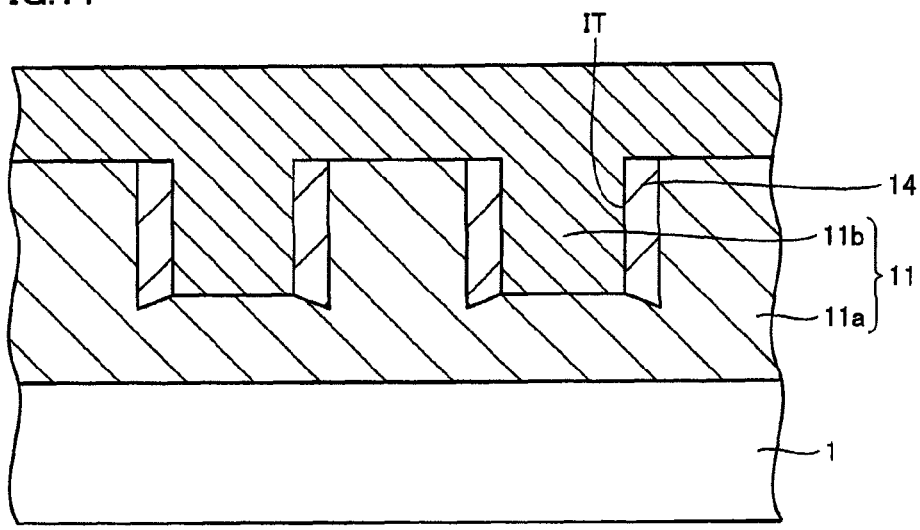

As shown in FIG. 11, upper layer 11b (second layer) of the n type is formed, filling internal trench IT and constituting first region 11 together with non-implantation region 11a. By formation of upper layer 11b, charge compensation region 14 is embedded in first region 11. Formation of upper layer 11b (second layer) is carried out by a method similar to the epitaxial growth of lower layer 5.

Figure 12:
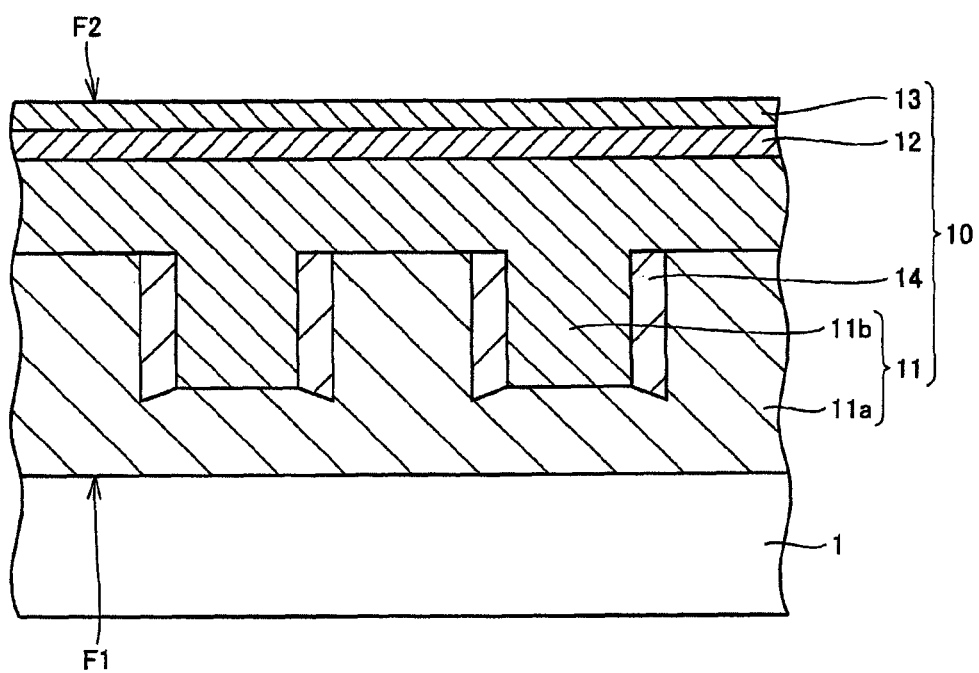

As shown in FIG. 12, p region 12 and n region 13 constituting upper face F2 are formed on upper layer 11b of n⁻ drift region 11. Specifically, by ion implantation towards the upper surface layer of upper layer 11b of n drift region 11, p region 12 and n region 13 are formed, and the portion not subject to ion implantation remains as upper layer 11b. By adjusting the acceleration energy of ions to be implanted, the region where p region 12 is formed can be adjusted. In the impurity ion implantation for p-type doping, aluminium (Al), for example, is employed as the impurity. In impurity ion implantation for n-type doping, phosphorus (P), for example, is employed as the impurity. At least one of p region 12 and n region 13 may be formed by epitaxial-growth, instead of by ion implantation.

Thus, SiC layer 10 is formed on single crystal substrate 1. SiC layer 10 has lower face F1 and upper face F2 opposite to each other in the thickness direction (the vertical direction in the drawing). Lower face F1 faces single crystal substrate 1. Upper face F2 is constituted of n region 13.

Figure 13:
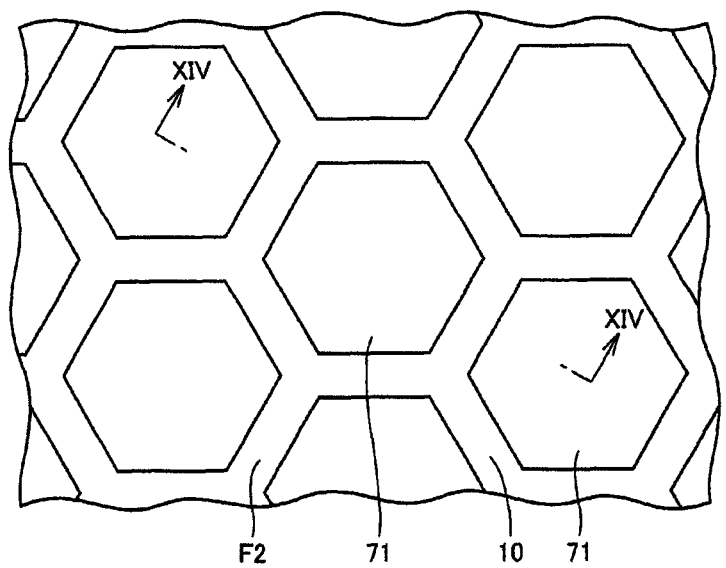
FIG. 13 is a partial plan view schematically representing a seventh step in the method for manufacturing a silicon carbide semiconductor device according to the first embodiment of the present invention.
Figure 14:
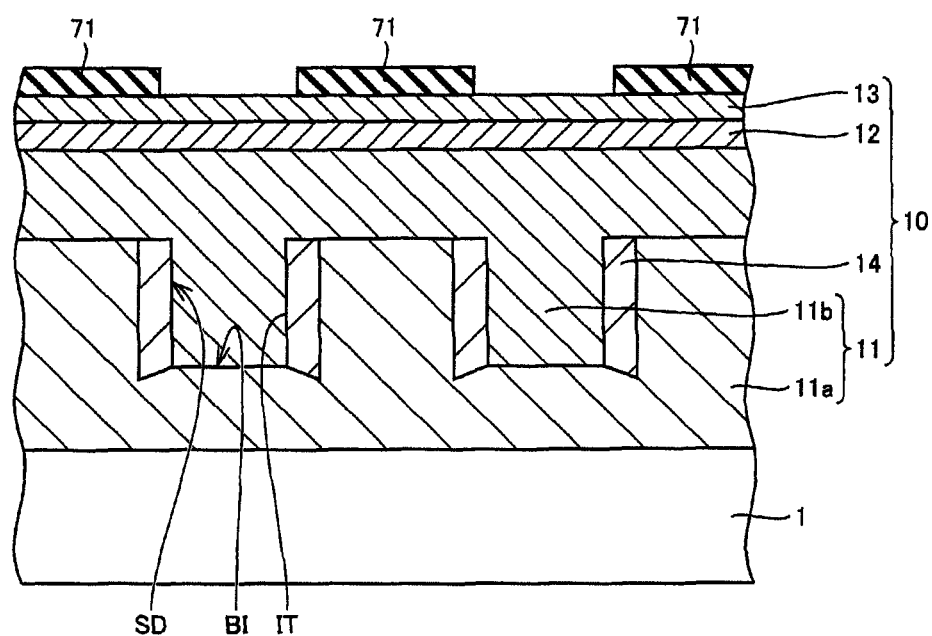
FIG. 14 is a schematic partial sectional view taken along line XIV-XIV in FIG. 13.

As shown in FIGS. 13 and 14, mask layer 71 is formed on upper face F2 of SiC layer 10. Mask layer 71 includes an opening corresponding to the site where gate trench GT (FIG. 1) is to be formed. Mask layer 71 is made of silicon oxide (SiO$_2$), for example.

Figure 15:
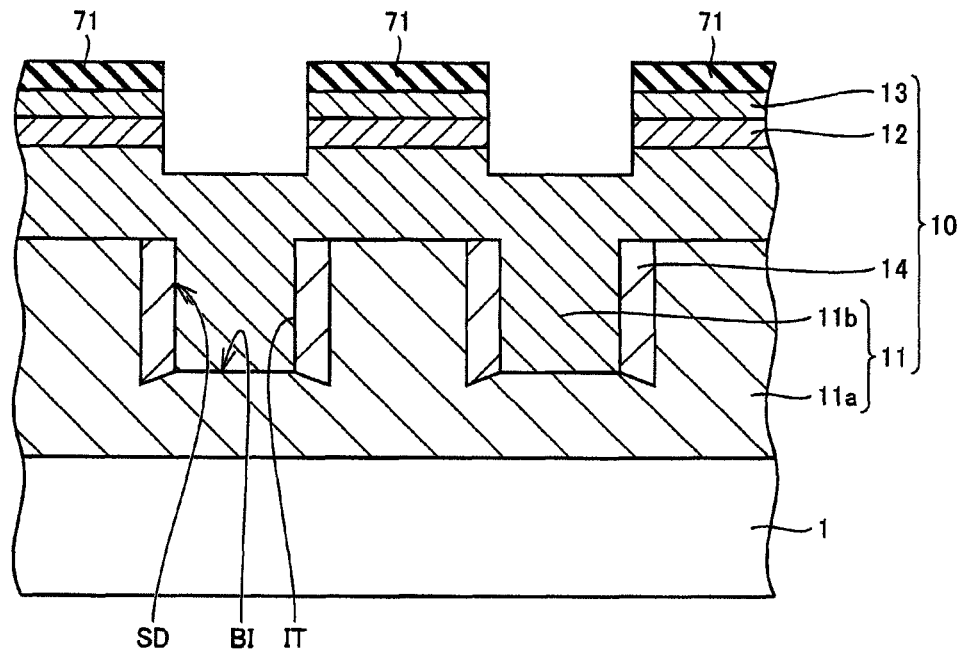
FIG. 15 is a partial sectional view schematically representing an eighth step in the method for manufacturing a silicon carbide semiconductor device according to the first embodiment of the present invention.

As shown in FIG. 15, by etching using mask layer 71, a recess is formed on upper face F2 of SiC layer 10 at the opening of mask layer 71. Preferably this etching is carried out through etching having a physical etching action.

Figure 16:
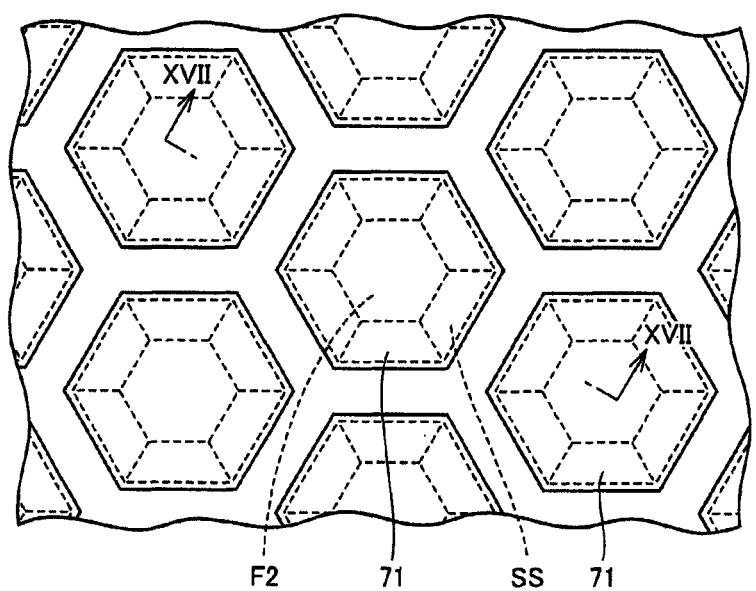
FIG. 16 is a partial plan view schematically representing a ninth step in the method for manufacturing a silicon carbide semiconductor device according to the first embodiment of the present invention.
Figure 17:
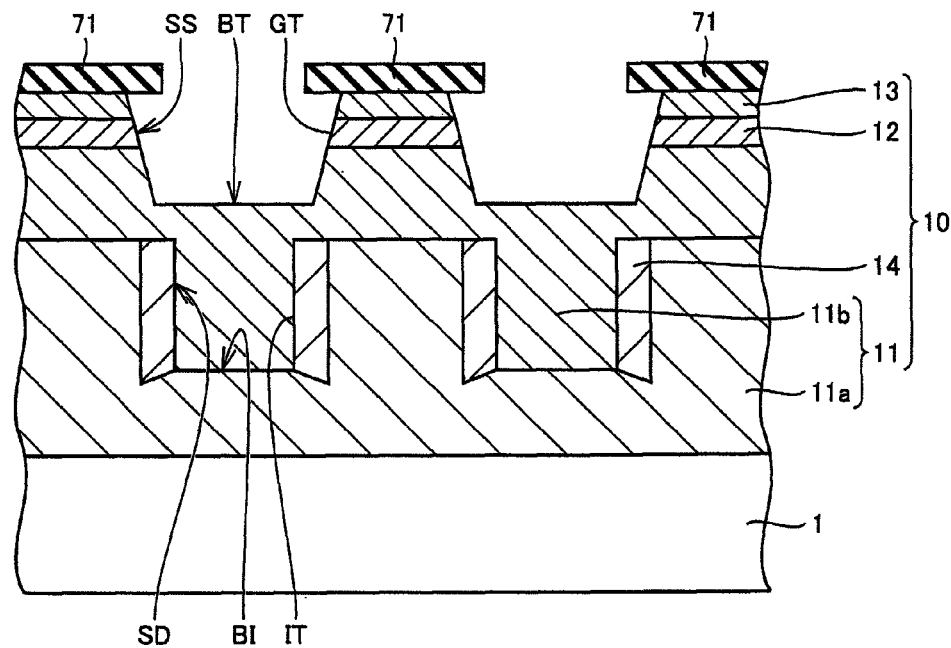
FIG. 17 is a schematic partial sectional view taken along line XVII-XVII in FIG. 16.
Figure 18:
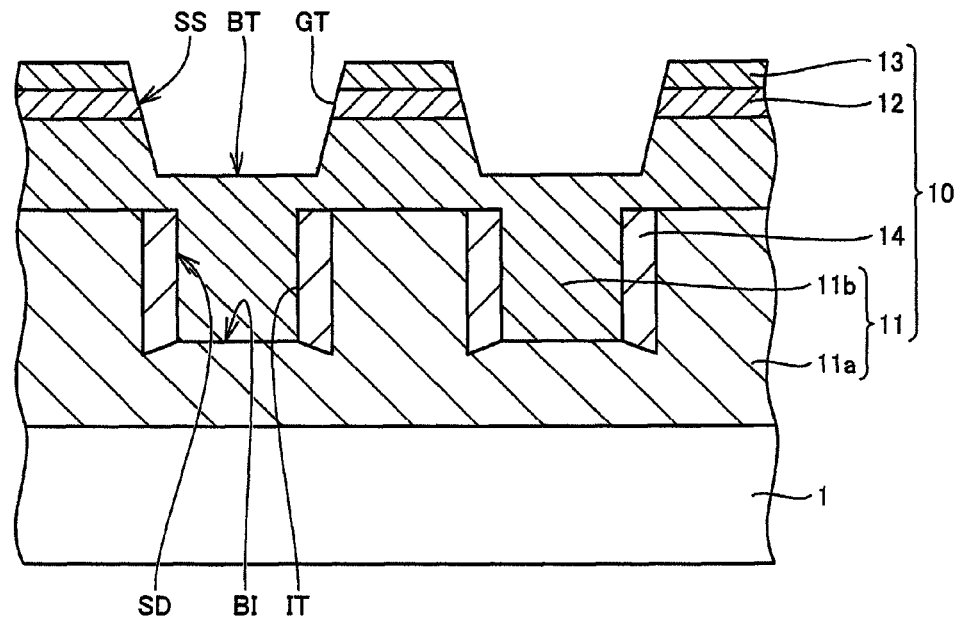
FIGS. 18-22 are partial sectional views schematically representing tenth to fourteenth steps, respectively, in the method for manufacturing a silicon carbide semiconductor device according to the first embodiment of the present invention.

As shown in FIGS. 16 and 17, gate trench GT is formed at upper face F2 by thermal etching of SiC layer 10 using mask layer 71. The details of thermal etching will be described afterwards. Then, mask layer 71 is removed (FIG. 18).

Figure 19:
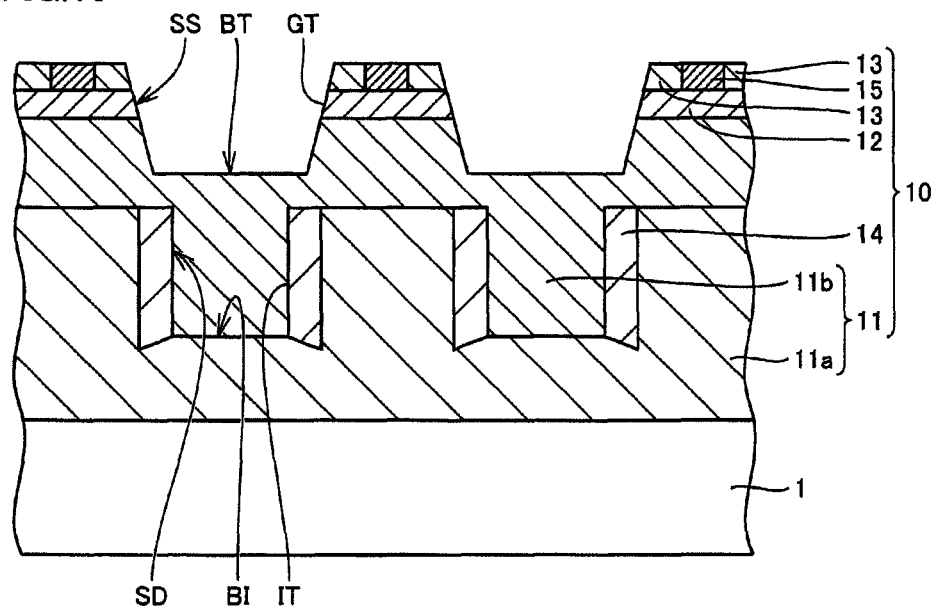

As shown in FIG. 19, $p^+$ contact region 15 is formed by impurity ion implantation. Then, activation annealing is carried out to activate the impurities implanted by ion implantation. For example, heating is carried out at the temperature of 1700° C. for 30 minutes.

Figure 20:
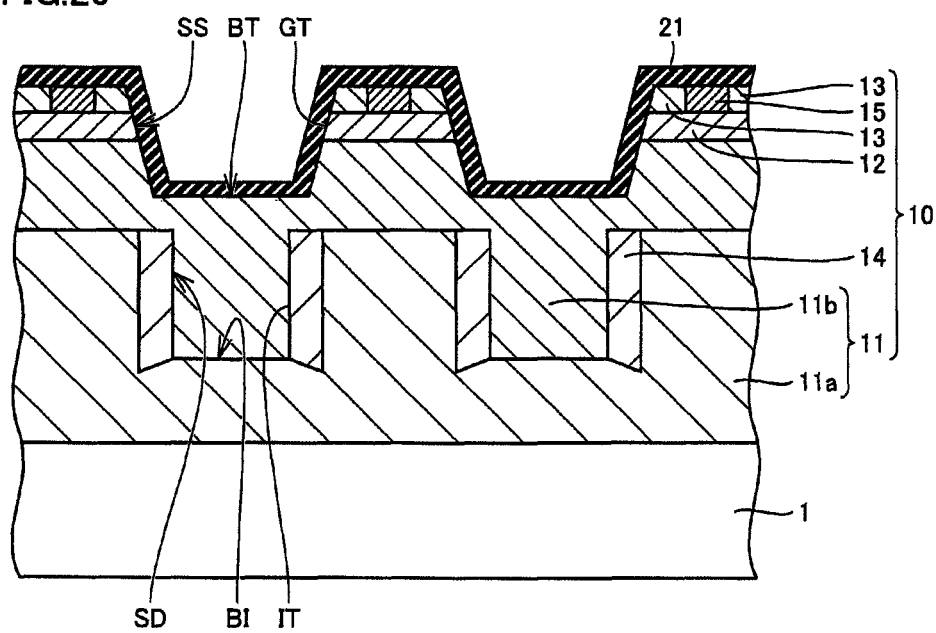

As shown in FIG. 20, the exposed face of SiC layer 10 is subjected to thermal oxidation to form gate oxide film 21. Since the inner face of gate trench GT is also subjected to thermal oxidation during this step, gate oxide film 21 covers p region 12 of SiC layer 10 on sidewall SS. In other words, gate oxide film 21 is formed on p region 12 to connect $n^-$ drift region 11 with n region 13.

Figure 21:
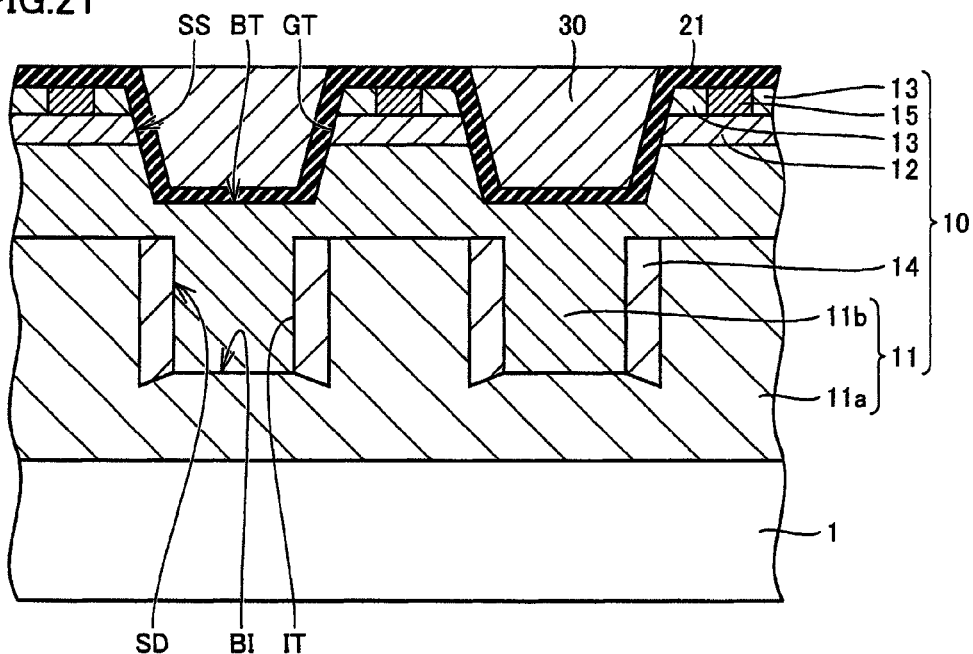

As shown in FIG. 21, gate electrode 30 is formed on gate oxide film 21 in gate trench GT. Gate electrode 30 is formed to have a portion located on p region 12 of SiC layer 10 with gate oxide film 21 therebetween.

Figure 22:
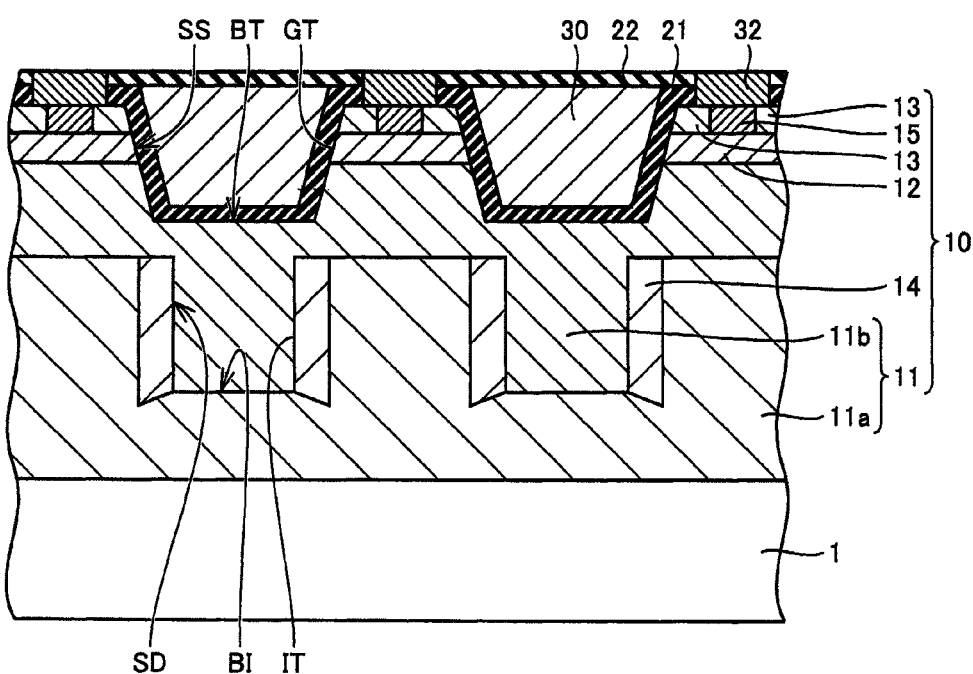

Referring to FIG. 22, interlayer insulation film 22 is formed on exposed gate oxide film 21 and gate electrode 30 (FIG. 21). Then, gate oxide film 21 and interlayer insulation film 22 are subjected to patterning to form an opening exposing $p^+$ contact region 15 and a portion of n region 13. Then, source electrode 32 is formed in this opening. Thus, the structure shown in FIG. 22 is obtained.

Referring to FIG. 1 again, source interconnection layer 33 is formed on interlayer insulation film 22 and source electrode 32. Further, drain electrode 31 is formed on $n^-$ drift region 11, i.e. on lower face F1 of SiC layer 10, with single crystal substrate 1 therebetween. Thus, MOSFET 100 is obtained.

Thermal etching employed in the above-described manufacturing method will be set forth below. Thermal etching is based on chemical reaction occurring by supplying process gas including reactive gas to an etching target heated up to a predetermined thermal treatment temperature.

For the reactive gas in the process gas, gas containing chlorine atoms, preferably chlorine based gas, more preferably chlorine gas, is employed. Thermal etching is preferably carried out under an atmosphere in which the partial pressure of the chlorine based gas is less than or equal to 50%. The process gas preferably includes oxygen atoms, for example, oxygen gas. In the case where chlorine gas and oxygen gas are both employed, the ratio of the flow rate of oxygen gas to the flow rate of chlorine gas is preferably greater than or equal to 0.1 and less than or equal to 2.0, more preferably the lower limit of this ratio is 0.25, in supplying process gas. Further, the process gas may include carrier gas. For the carrier gas, nitrogen gas, argon gas, helium gas, or the like, for example, may be employed. Thermal etching is carried out preferably under reduced pressure, and more preferably, the pressure is less than or equal to 1/10 the pressure of the atmosphere.

The thermal treatment temperature is preferably greater than or equal to 700° C., more preferably greater than or equal to 800° C., and further preferably greater than or equal to 900° C. Accordingly, the etching rate can be increased. Furthermore, the thermal treatment temperature is preferably less than or equal to 1200° C., more preferably less than or equal to 1100° C., and further preferably less than or equal to 1000° C. Accordingly, the device used for thermal etching can be a simpler one. For example, a device using a quartz member may be employed.

Mask layer 71 for thermal etching (FIG. 17) is preferably made of silicon oxide. Accordingly, the consumption of the mask during etching can be suppressed.

By the thermal etching set forth above, a crystal plane having high chemical stability and crystallographically specific can be provided in self-formation as sidewall SS (FIG. 2) of gate trench GT. The crystal plane formed may include at least one of a {0-33-8} plane and {0-11-4} plane when the crystal structure of SiC layer 10 corresponds to the hexagonal system. When the crystal structure thereof corresponds to the cubic system, the crystal plane may include the {100} plane.

The method of using MOSFET 100 (FIG. 1) and the functional effect of the present embodiment will be described hereinafter.

MOSFET 100 is used as a switching element for switching the current path between drain electrode 31 and source interconnection layer 33. A positive voltage relative to source interconnection layer 33 is applied to drain electrode 31. When a positive voltage greater than or equal to the threshold voltage is applied to gate electrode 30, an inversion layer is present at p region 12 on sidewall SS of gate trench GT, i.e. at the channel region. Therefore, $n^-$ drift region 11 is electrically connected to n region 13, which is an ON state of MOSFET 100.

When application of a voltage greater than or equal to the threshold voltage to gate electrode 30 is stopped, the aforementioned inversion layer is eliminated. Therefore, carrier supply from source interconnection layer 33 towards n drift region 11 is stopped. As a result, depletion proceeds from the pn junction plane by n drift region 11 and p region 12 towards drain electrode 31. Thus, $n^-$ drift region 11 and charge compensation region 14 are depleted.

The positive fixed charge of depleted $n^-$ drift region 11 becomes a factor in increasing the electric field intensity in the thickness direction on the pn junction plane. Depleted charge compensation region 14 has negative fixed charge, which cancels at least a portion of the aforementioned electric field intensity. In other words, charge compensation region 14 functions as a charge compensation structure. Accordingly, the maximum value of the electric field intensity in the thickness direction is suppressed. Thus, the breakdown voltage of MOSFET 100 can be improved.

Charge compensation region 14 (FIG. 2) has a thickness TH preferably greater than 5 μm in thickness direction DD. Accordingly, the charge compensation structure is provided over a larger range in thickness direction DD. Thus, the breakdown voltage of MOSFET 100 can be further improved.

Charge compensation region 14 (FIG. 1) is located away from p region 12. Therefore, the event of the impurities in charge compensation region 14 affecting p region 12 functioning as a channel can be avoided.

Charge compensation region 14 is formed by irradiating sidewall SD of internal trench IT with impurity ion beam IB (FIG. 10) in an oblique direction relative to lower face F1 (FIG. 10). Accordingly, impurity ion beam IB can be delivered effectively on sidewall SD. This oblique direction is selected such that at least the portion of bottom BI of internal trench IT is located in a shadow of sidewall SD. Accordingly, at least a portion of bottom BI of internal trench IT does not become charge compensation region 14. Therefore, at least a portion of bottom BI of internal trench IT is maintained at the n type. Therefore, an n type current path passing through internal trench IT can be provided. Thus, the ON resistance of MOSFET 100 can be reduced.

During formation of internal trench IT (FIG. 9), etching is carried out through etching having a physical etching action. Accordingly, the etching directed to forming internal trench IT can be carried out more perpendicularly. Therefore, side face SD of charge compensation region 14 (FIG. 2), including sidewall SD of internal trench IT, can be set in the thickness direction DD. Thus, charge compensation by charge compensation region 14 can be effected more sufficiently.

In the present embodiment, thermal etching is employed in forming gate trench GT. Accordingly, the plane orientation of sidewall SS of gate trench GT can be provided in self-formation as a crystallographically specific one. Preferably, sidewall SS of gate trench GT is oblique by just an angle AF (FIG. 2) greater than 0° and smaller than 90°, relative to upper face F2 of SiC layer 10. Accordingly, a channel plane having a plane orientation oblique to upper face F2 can be provided on sidewall SS of gate trench GT. More preferably, the angle of side face SD (FIG. 2) of charge compensation region 14 relative to thickness direction DD is smaller than angle AD of sidewall SS of gate trench GT relative to thickness direction DD. Accordingly, the charge compensation by virtue of charge compensation region 14 can be effected more sufficiently.

SiC layer 10 may have a crystal structure of hexagonal system. In this case, sidewall SS of gate trench GT of SiC layer 10 preferably includes a region constituted of at least one of the {0-33-8} plane and {0-11-4} plane. Accordingly, the carrier mobility on sidewall SS can be increased. Therefore, the ON resistance of MOSFET 100 can be suppressed.

SiC layer 10 may have a crystal structure of cubic system. In this case, sidewall SS of gate trench GT of SiC layer 10 preferably includes a region constituted of the {100} plane. Accordingly, the carrier mobility on sidewall SS can be increased. Therefore, the ON resistance of MOSFET 100 can be suppressed.

In the present embodiment, the cross section of gate trench GT (FIG. 2) is, but not limited to, a trapezoidal shape. For example, it may be a V shape. In other words, the bottom of the gate trench does not necessarily have to be a flat plane.

Further, gate trench GT may be formed by dry etching, other than thermal etching. For example, gate trench GT may be formed by RIE or IBE, for example. Moreover, gate trench GT may be formed by etching other than dry etching, for example, by wet etching. The sidewalls of the gate trench facing each other do not necessarily have to be in a non-parallel position relationship, as shown in FIG. 1. The sidewalls may take a parallel relationship with respect to each other.

Figure 4:
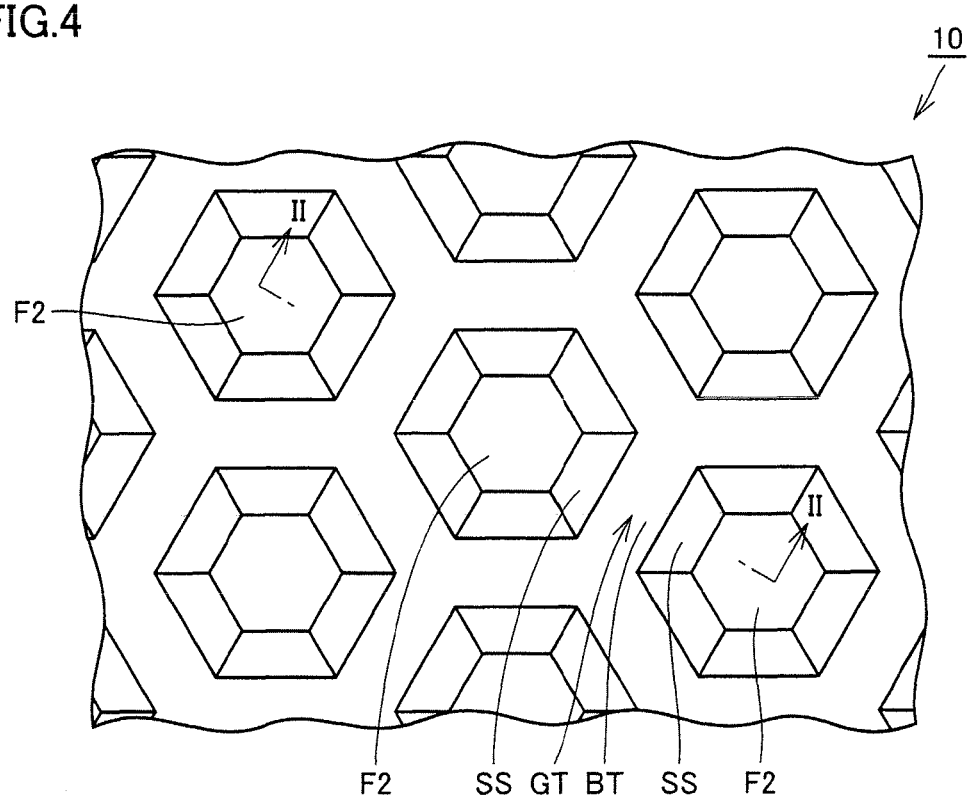
Figure 5:
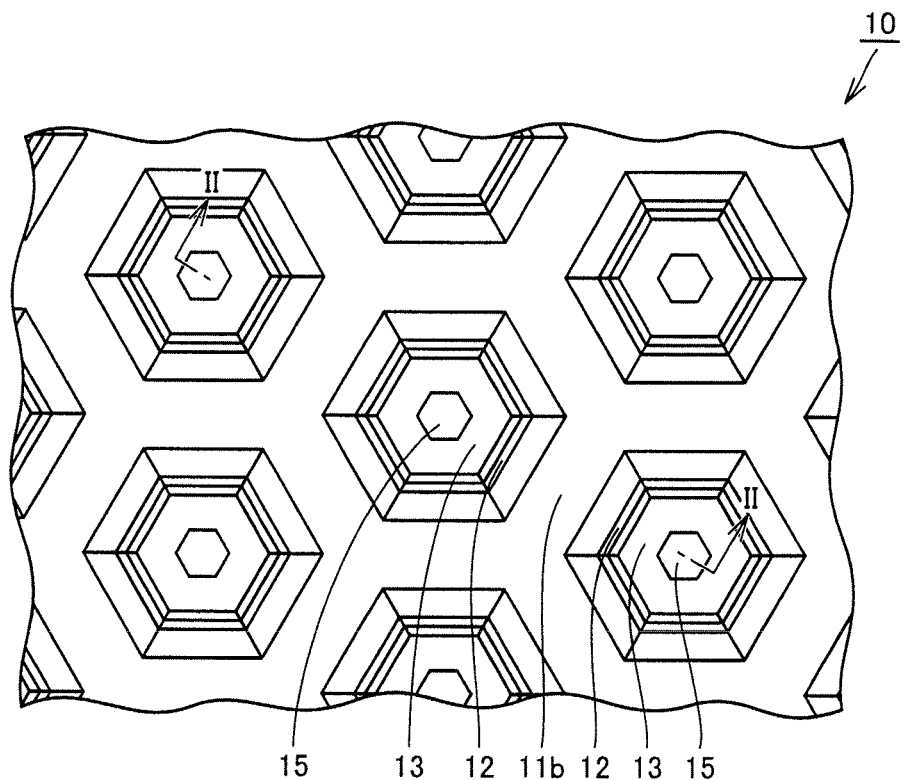
FIG. 5 is a partial plan view showing in further detail a configuration of the silicon carbide layer in FIG. 4.

In the embodiment set forth above, the region of upper face F2 surrounded by sidewall SS of gate trench GT has a hexagonal shape, as shown in FIG. 4. The shape of this region is not limited to a hexagon, and may be a rectangle (including a square), for example. For this shape, a hexagon in which each corner has an angle of approximately 60° is preferable when the crystal structure of SiC layer 10 is hexagonal. In the case where the crystal structure is cubic, a rectangle is preferable.

Second Embodiment

Figure 23:
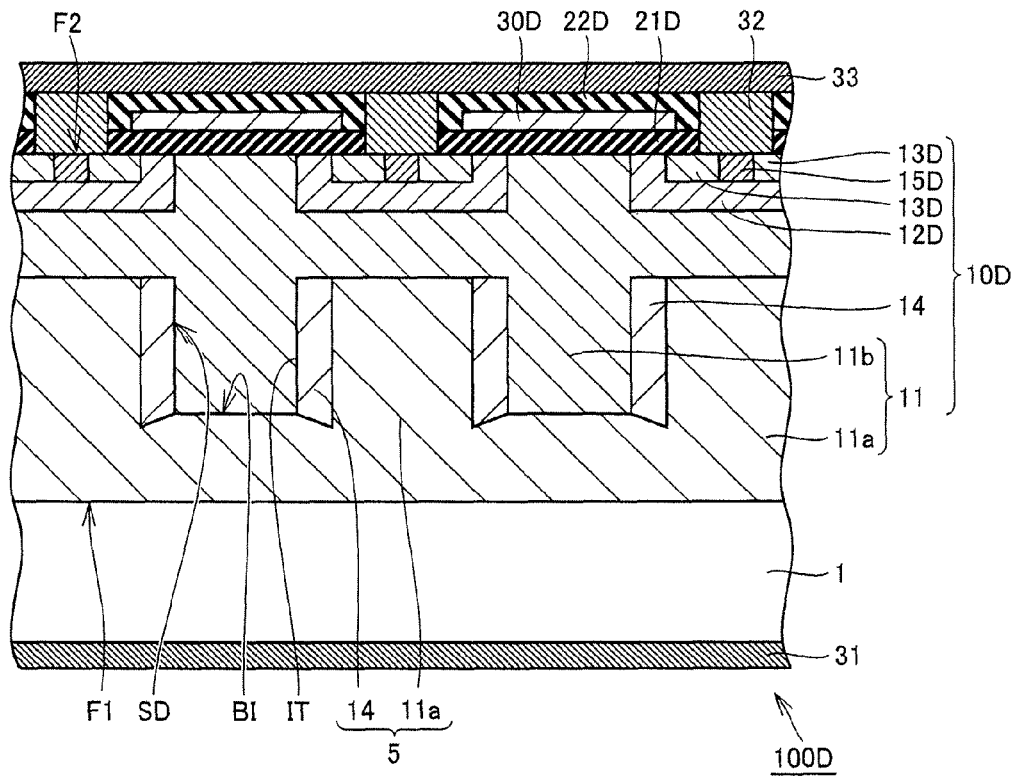
FIG. 23 is a partial sectional view schematically representing a configuration of a silicon carbide semiconductor device according to a second embodiment of the present invention.

As shown in FIG. 23, an MOSFET 100D includes a single crystal substrate 1, a SiC layer 10D, a drain electrode 31, a source electrode 32, a gate oxide film 21D, an interlayer insulation film 22D, a gate electrode 30D, and a source interconnection layer 33.

Figure 24:
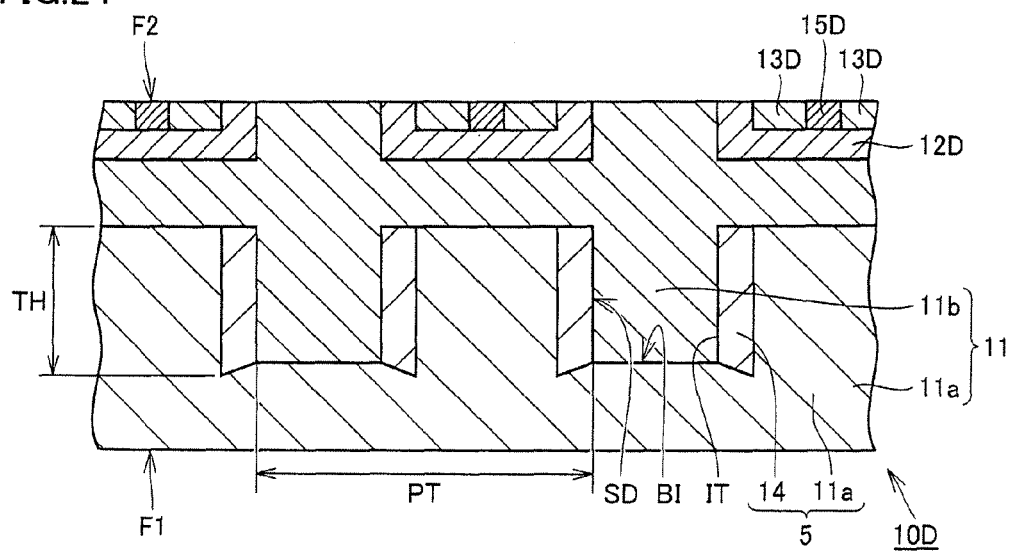
FIG. 24 is a partial sectional view schematically representing a configuration of a silicon carbide layer in the silicon carbide semiconductor device of FIG. 23.

Referring to FIG. 24, SiC layer 10D has a lower face F1 (first surface) and an upper face F2 (second surface) opposite to each other in the thickness direction (vertical direction in the drawing). SiC layer 10D includes an n⁻ drift region 11 (first region), a p region 12D (second region), an n region 13D (third region), a charge compensation region 14 (implantation region), and a p⁺ contact region 15D. P region 12D is provided on upper layer 11b of n⁻ drift region 11, and is of the p-type (second conductivity type differing from the first conductivity type). N region 13D is formed on p region 12D, isolated from n⁻ drift region 11 by p region 12D, and is of the n-type (first conductivity type). P⁺ contact region 15D is directly provided on a portion of p region 12D, constituting a portion of upper face F2 of SiC layer 10D.

P region 12D is located away from charge compensation region 14. Specifically, p region 12D is isolated from charge compensation region 14 by upper layer 11b of n⁻ drift region 11.

Gate oxide film 21D is provided on upper face F2 of SiC layer 10D, above p region 12D to connect n⁻ drift region 11 with n region 13D. Specifically, gate oxide film 21D covers p region 12D on upper face F2 of SiC layer 10D. Gate electrode 30D is provided on gate oxide film 21D. Accordingly, gate electrode 30D is located on p region 12D of SiC layer 10D with gate oxide film 21D therebetween.

Source electrode 32 is directly provided on n region 13D and p⁺ contact region 15D of SiC layer 10D.

SiC layer 10D may have a crystal structure of hexagonal system. In this case, upper face F2 of SiC layer 10D preferably includes a region constituted of at least one of the {0-33-8} plane and {0-11-4} plane. SiC layer 10D may have a crystal structure of cubic system. In this case, upper face F2 of SiC layer 10D preferably includes a region constituted of the {100} plane.

Elements in the structure other than those set forth above are substantially identical to those of the first embodiment set forth above. The same or corresponding elements have the same reference characters allotted, and description thereof will not be repeated.

A method for manufacturing MOSFET 100D will be described hereinafter. First, steps similar to those shown in FIGS. 6-11 of the first embodiment are carried out.

Figure 25:
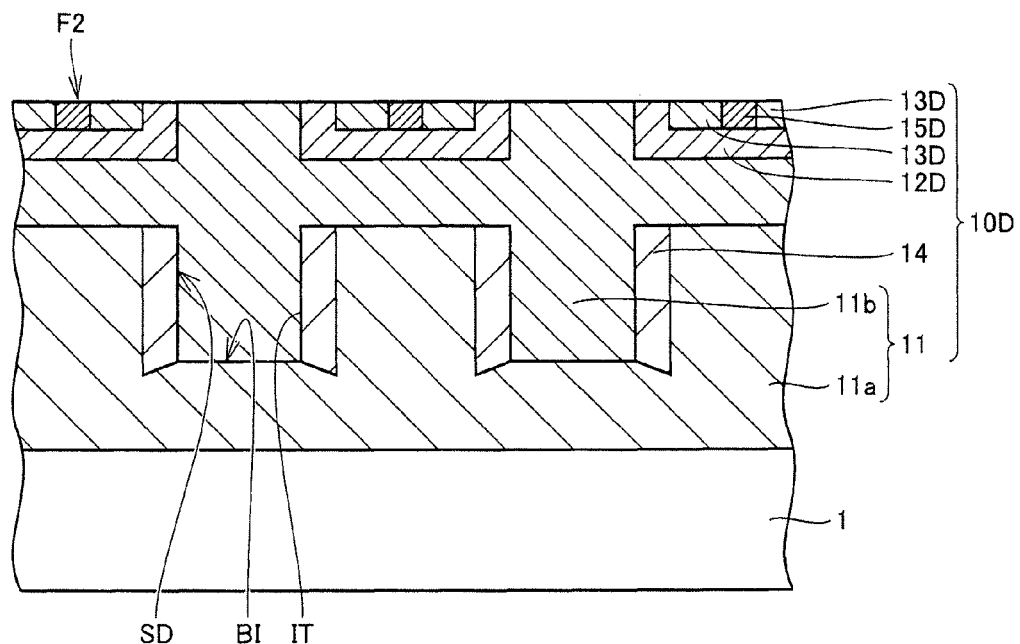
FIGS. 25 and 26 are partial sectional views schematically representing first and second steps, respectively, in the method for manufacturing a silicon carbide semiconductor device according to the second embodiment of the present invention.

As shown in FIG. 25, p region 12D, n region 13D and p⁺ contact region 15D are formed on upper layer 11b of n⁻ drift region 11 by impurity ion implantation. Then, activation annealing is carried out to activate the impurities implanted by ion implantation. For example, heating is carried out at the temperature of 1700° C. for 30 minutes. Accordingly, SiC layer 10D is formed on single crystal substrate 1.

Figure 26:
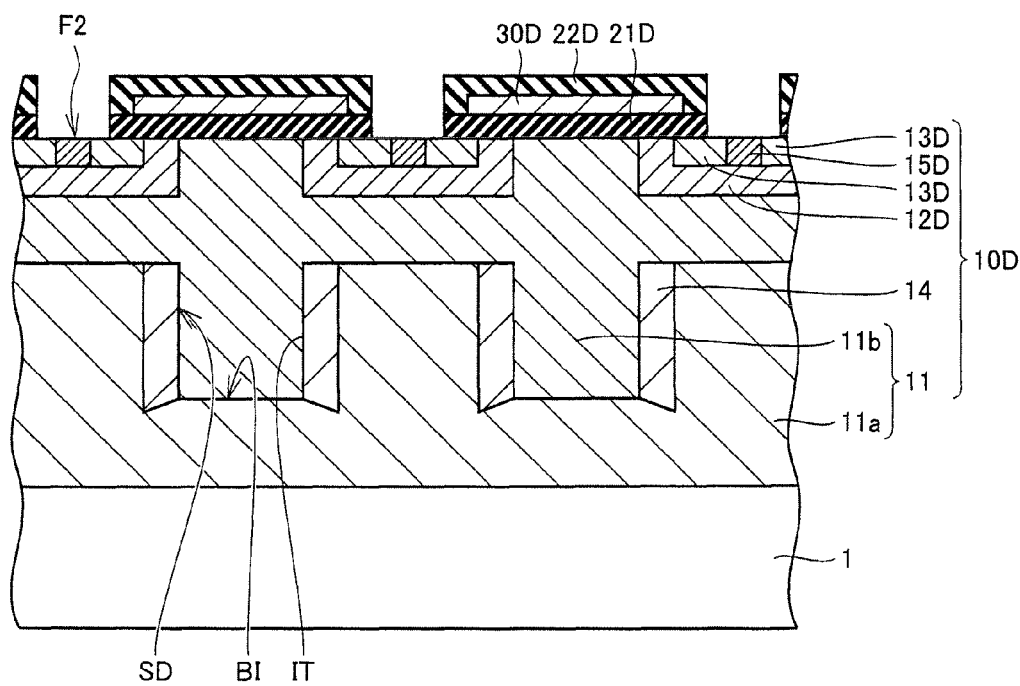

Referring to FIG. 26, gate oxide film 21D is formed by thermal oxidation on upper face F2 of SiC layer 10D. Accordingly, p region 12D is covered with gate oxide film 21D. Gate electrode 30D is formed on gate oxide film 21D. Gate electrode 30D is formed to have a portion located above p region 12D of SiC layer 10D with gate oxide film 21D therebetween. Interlayer insulation film 22 is formed on the exposed gate oxide film 21D and gate electrode 30D. By gate oxide film 21D and interlayer insulation film 22D being subjected to patterning, an opening is formed, exposing p⁺ contact region 15D and a portion of n region 13D. Then, source electrode 32 is formed in this opening. Thus, the configuration shown in FIG. 26 is obtained.

Referring to FIG. 23 again, source interconnection layer 33 is formed on interlayer insulation film 22D and source electrode 32. Further, drain electrode 31 is formed on n⁻ drift region 11, i.e. on lower face F1 of SiC layer, with single crystal substrate 1 therebetween. Thus, MOSFET 100D is obtained.

In the method for manufacturing MOSFET 100 (FIG. 1) or MOSFET 100D (FIG. 23) in the embodiments set forth above, a step of removing single crystal substrate 1 may be carried out, prior to formation of drain electrode 31. In this case, MOSFET 100 (FIG. 1) is absent of single crystal substrate 1, and drain electrode 31 is directly provided on n⁻ drift region 11, i.e. on lower face F1.

The first conductivity type is not limited to the n-type, and may be the p-type. The MOSFET is of the n channel type when the first conductivity type is the n-type, and is of the p channel type when the first conductivity type is the p-type.

Moreover, the silicon carbide semiconductor device is not limited to an MOSFET, and may be an MISFET (Metal Insulator Semiconductor Field Effect Transistor) other than an MOSFET.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a silicon carbide semiconductor device including a silicon carbide layer having a first surface and a second surface opposite to each other in a thickness direction, said method comprising the steps of:

preparing a first layer constituting said first surface and of a first conductivity type, forming an internal trench having a bottom and a sidewall, at a face opposite to said first surface of said first layer, implanting impurities onto said sidewall of said internal trench such that the conductivity type of said first layer is inverted on said sidewall of said internal trench, by said step of implanting impurities, an implantation region located on said sidewall of said internal trench and of a second conductivity type differing from said first conductivity type, and a non-implantation region of said first conductivity type are formed from said first layer, forming a second layer of said first conductivity type, filling said internal trench, and constituting a first region together with said non-implantation region, said implantation region being embedded in said first region by said step of forming a second layer, forming, on said first region, a second region of said second conductivity type, and a third region of said first conductivity type, provided on said second region, isolated from said first region by said second region, and constituting at least a portion of said second surface, and forming a gate insulation film on said second region so as to connect said first region with said third region, forming a gate electrode on said gate insulation film, forming a first electrode on said first region, and forming a second electrode on said third region.

2. The method for manufacturing a silicon carbide semiconductor device according to claim 1, wherein said step of forming an implantation region includes the step of irradiating said sidewall of said internal trench with an impurity ion beam in an oblique direction relative to said first surface.

3. The method for manufacturing a silicon carbide semiconductor device according to claim 2, wherein, in said step of irradiating with an impurity ion beam, said oblique direction is selected such that at least a portion of said bottom of said internal trench is located in a shadow of said sidewall.

4. The method for manufacturing a silicon carbide semiconductor device according to claim 1, wherein said step of forming an internal trench is carried out through etching having a physical etching action.

5. The method for manufacturing a silicon carbide semiconductor device according to claim 1, further comprising the step of forming a gate trench having a sidewall, at said second surface, passing through said third region and said second region up to said first region, and located away from said implantation region, wherein said step of forming a gate trench is carried out by thermal etching.

\* \* \* \* \*